(12) United States Patent
Wada et al.

(10) Patent No.: US 9,153,661 B2
(45) Date of Patent: Oct. 6, 2015

(54) SEMICONDUCTOR DEVICE AND METHOD FOR MANUFACTURING SAME

(71) Applicant: Sumitomo Electric Industries, Ltd., Osaka-shi (JP)

(72) Inventors: Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/490,391

(22) Filed: Sep. 18, 2014

(65) Prior Publication Data

US 2015/0004757 A1     Jan. 1, 2015

Related U.S. Application Data

(62) Division of application No. 13/679,576, filed on Nov. 16, 2012, now Pat. No. 8,866,262.

(60) Provisional application No. 61/579,466, filed on Dec. 22, 2011.

(30) Foreign Application Priority Data

Dec. 22, 2011   (JP) ................................. 2011-280650

(51) Int. Cl.
*H01L 29/732* (2006.01)
*H01L 29/66* (2006.01)
(Continued)

(52) U.S. Cl.
CPC .... *H01L 29/66333* (2013.01); *H01L 21/02529* (2013.01); *H01L 21/043* (2013.01);
(Continued)

(58) Field of Classification Search
CPC ...................... H01L 29/1608; H01L 29/41708; H01L 29/42304; H01L 29/7395; H01L 21/02529; H01L 21/0455; H01L 29/66333; H01L 29/66068; H01L 29/0834
See application file for complete search history.

(56) References Cited

U.S. PATENT DOCUMENTS 5,319,221 A     6/1994   Ueno
6,475,887 B1   11/2002   Kawasaki et al.
(Continued)

FOREIGN PATENT DOCUMENTS

EP          1667237 A2    6/2006
JP      H05-211158 A      8/1993
(Continued)

OTHER PUBLICATIONS

International Search Report in International Application No. PCT/JP2012/076689 dated Jan. 15, 2013.
(Continued)

*Primary Examiner* — Bac Au
*Assistant Examiner* — Toniae Thomas
(74) *Attorney, Agent, or Firm* — Venable LLP; Michael A. Sartori; Trent B. Ostler

(57) ABSTRACT

A silicon carbide substrate includes: an n type drift layer having a first surface and a second surface opposite to each other; a p type body region provided in the first surface of the n type drift layer; and an n type emitter region provided on the p type body region and separated from the n type drift layer by the p type body region. A gate insulating film is provided on the p type body region so as to connect the n type drift layer and the n type emitter region to each other. A p type Si collector layer is directly provided on the silicon carbide substrate to face the second surface of the n type drift layer.

7 Claims, 5 Drawing Sheets

(51) Int. Cl.
*H01L 29/739* (2006.01)
*H01L 29/08* (2006.01)
*H01L 29/165* (2006.01)
*H01L 21/02* (2006.01)
*H01L 21/04* (2006.01)
*H01L 29/16* (2006.01)

(52) U.S. Cl.
CPC ........ *H01L21/0455* (2013.01); *H01L 29/0834* (2013.01); *H01L 29/165* (2013.01); *H01L 29/66068* (2013.01); *H01L 29/7393* (2013.01); *H01L 29/7395* (2013.01); *H01L 29/1608* (2013.01)

(56) References Cited

U.S. PATENT DOCUMENTS

| | | |
|---|---|---|
| 6,956,238 B2 | 10/2005 | Ryu et al. |
| 7,795,691 B2 | 9/2010 | Zhang et al. |
| 8,728,877 B2* | 5/2014 | Wada et al. ................ 438/136 |
| 8,765,562 B2* | 7/2014 | Hiyoshi et al. ............. 438/311 |
| 2002/0158277 A1 | 10/2002 | Harada et al. |
| 2003/0107041 A1* | 6/2003 | Tanimoto et al. ............. 257/77 |
| 2004/0262714 A1 | 12/2004 | Noda et al. |
| 2006/0118818 A1 | 6/2006 | Shimoida et al. |
| 2008/0076238 A1 | 3/2008 | Miyashita et al. |
| 2008/0135870 A1 | 6/2008 | Okada et al. |
| 2008/0315250 A1 | 12/2008 | Onozawa |
| 2010/0051963 A1 | 3/2010 | Otremba |
| 2010/0173476 A1 | 7/2010 | Nakazawa |
| 2010/0193796 A1 | 8/2010 | Nakano |
| 2010/0301335 A1 | 12/2010 | Ryu et al. |
| 2011/0207275 A1 | 8/2011 | Tanaka et al. |
| 2012/0018743 A1 | 1/2012 | Hiyoshi et al. |
| 2012/0175638 A1 | 7/2012 | Hiyoshi et al. |
| 2012/0309174 A1 | 12/2012 | Hiyoshi et al. |
| 2013/0001703 A1 | 1/2013 | Sugawara |
| 2013/0078771 A1* | 3/2013 | Hiyoshi et al. ................ 438/135 |
| 2013/0171778 A1* | 7/2013 | Wada et al. .................... 438/135 |
| 2013/0175549 A1 | 7/2013 | Okumura |
| 2013/0248883 A1 | 9/2013 | Das et al. |

FOREIGN PATENT DOCUMENTS

| | | |
|---|---|---|
| JP | 2000-357801 A | 12/2000 |
| JP | 2002-359294 A | 12/2002 |
| JP | 2004-304099 A | 10/2004 |
| JP | 2005-236160 A | 9/2005 |
| JP | 2006-179662 A | 7/2006 |
| JP | 2006-186307 A | 7/2006 |
| JP | 2008-016466 A | 1/2008 |
| JP | 2008-085050 A | 4/2008 |
| JP | 2008-117881 A | 5/2008 |
| JP | 2008-177296 A | 7/2008 |
| JP | 2008-288349 A | 11/2008 |
| JP | 2010-027833 A | 2/2010 |
| JP | 2010-141136 A | 6/2010 |
| JP | 2010-529646 A | 8/2010 |
| JP | 2011-151428 A | 8/2011 |
| WO | WO-00/16382 A1 | 3/2000 |
| WO | WO-2008/156516 A2 | 12/2008 |

OTHER PUBLICATIONS

Notice of Grounds of Rejection in Japanese Patent Application No. 2011-280650, dated May 7, 2015.
Extended European Search Report in European Patent Application No. 12860644.9, dated Jul. 16, 2015.

* cited by examiner

SEMICONDUCTOR DEVICE AND METHOD FOR MANUFACTURING SAME

CROSS-REFERENCE TO RELATED APPLICATIONS

This application is a Divisional of U.S. patent application Ser. No. 13/679,576, filed Nov. 16, 2012, which claims the benefit of U.S. Provisional Application No. 61/579,466, filed Dec. 22, 2011 and Japanese Patent Application No. 2011-280650, filed Dec. 22, 2011, all of which are incorporated by reference in their entirety.

BACKGROUND OF THE INVENTION

1. Field of the Invention

The present invention relates to a semiconductor device and a method for manufacturing the semiconductor device, more particularly, a semiconductor device having a silicon carbide substrate and a method for manufacturing such a semiconductor device.

2. Description of the Background Art

Japanese Patent Laying-Open No. 2008-288349 (Patent Literature 1) discloses an n type IGBT (Insulated Gate Bipolar Transistor) employing a silicon substrate. Such an IGBT has a p type collector layer, which is formed by means of ion implantation and heat treatment after forming a structure of the emitter side on a silicon substrate.

In recent years, instead of a silicon substrate, use of a silicon carbide substrate has been considered as a substrate for a power semiconductor device. An impurity provided in silicon carbide (SiC) by means of ion implantation is activated normally at a heat treatment temperature of approximately 1500° C. or greater, which is much higher than the heat treatment temperature for activating an impurity provided in silicon by means of ion implantation. Accordingly, if the technique of Japanese Patent Laying-Open No. 2008-288349 is applied to a method for manufacturing an IGBT using a silicon carbide substrate, the structure of emitter side is damaged due to the high-temperature heating. Accordingly, it is difficult to apply this technique.

Japanese National Patent Publication No. 2010-529646 (Patent Literature 2) discloses that when manufacturing an IGBT using a silicon carbide substrate, a p type collector layer is formed on an n type silicon carbide substrate by means of epitaxial growth, then a structure of emitter side is formed, and then the n type silicon carbide substrate is removed.

According to the technique described in Japanese National Patent Publication No. 2010-529646, epitaxial growth of p type SiC is required to form the p type collector layer. However, this technique is highly difficult. In particular, it is highly difficult to attain the epitaxial growth of p type SiC on an n type silicon carbide substrate, which can be manufactured readily to have higher quality and larger size than a p type silicon carbide substrate.

SUMMARY OF THE INVENTION

The present invention has been made to solve the foregoing problem, and has one object to provide a semiconductor device that has a silicon carbide substrate and a p type collector layer and that can be manufactured readily. Another object thereof is to provide a method for manufacturing a semiconductor device, whereby a semiconductor device having a silicon carbide substrate and a p type collector layer can be readily manufactured.

A semiconductor device includes a silicon carbide substrate, a gate insulating film, a gate electrode, an emitter electrode, and a p type Si collector layer. The silicon carbide substrate includes an n type drift layer having first and second surfaces opposite to each other, a p type body region provided in the first surface of the n type drift layer, and an n type emitter region provided on the p type body region and separated from the n type drift layer by the p type body region. The gate insulating film is provided on the p type body region so as to connect the n type drift layer and the n type emitter region to each other. The gate electrode is provided on the gate insulating film. The emitter electrode is in contact with each of the n type emitter region and the p type body region. The p type Si collector layer is directly provided on the silicon carbide substrate to face the second surface of the n type drift layer.

According to the above-described semiconductor device, each of the emitter region, the body region, and the drift region is made of silicon carbide, so that a semiconductor device employing properties of silicon carbide is obtained. Further, because the Si layer is used as the collector layer, epitaxial growth of p type SiC, which is highly difficult, is not required in forming the collector layer. Hence, the semiconductor device can be manufactured more readily.

In the semiconductor device, the p type Si collector layer may be made of polysilicon. In this way, the p type Si collector layer can be adapted to have an electric conductivity higher than that in the case where the p type Si collector layer is made of amorphous silicon.

In the semiconductor device, the p type Si collector layer may be made of amorphous silicon. Accordingly, the p type Si collector layer can be formed at a temperature lower than that in the case where the p type Si collector layer is made of polysilicon.

In the semiconductor device, the silicon carbide substrate may include a p type SiC layer separated from the p type body region by the n type drift layer and disposed directly on the p type Si collector layer. In this way, in addition to the p type Si collector layer, the p type SiC layer can be used as a source of supply of positive holes into the n type drift layer. Thus, more sufficient amount of positive holes can be supplied into the n type drift layer.

A method for manufacturing a semiconductor device in the present invention includes the following steps. A silicon carbide substrate having an n type single-crystal substrate made of silicon carbide and an n type drift layer provided thereon is formed by epitaxially growing silicon carbide on the n type single-crystal substrate while adding a donor type impurity thereto. The n type drift layer has first and second surfaces opposite to each other. The second surface faces the n type single-crystal substrate. There are formed a p type body region disposed in the first surface of the n type drift layer, and an n type emitter region disposed on the p type body region and separated from the n type drift layer by the p type body region. A gate insulating film is formed on the p type body region so as to connect the n type drift layer and the n type emitter region to each other. A gate electrode is formed on the gate insulating film. An emitter electrode is formed in contact with each of the n type emitter region and the p type body region. A p type Si collector layer facing the second surface of the n type drift layer is formed by depositing silicon on the silicon carbide substrate while adding an acceptor type impurity thereto.

According to the above-described semiconductor device, each of the emitter region, the body region, and the drift region is made of silicon carbide, so that a semiconductor device employing properties of silicon carbide is obtained.

Further, because the Si layer is used as the collector layer, epitaxial growth of p type SiC, which is highly difficult, is not required in forming the collector layer. Hence, the semiconductor device can be manufactured more readily. Further, by using the Si layer as the collector layer, temperature required for the step of forming the collector layer can be made low. Accordingly, damage that can be caused by the heating during the formation of the collector layer can be suppressed.

In the above-described manufacturing method, activation heat treatment for the p type Si collector layer may be performed. In this way, the impurity in the p type Si collector layer can be more activated.

In the above-described manufacturing method, a collector electrode may be formed on the p type Si collector layer after performing the activation heat treatment. Accordingly, electrical connection with the p type Si collector layer can be readily achieved.

In the above-described manufacturing method, during the activation heat treatment, the p type Si collector layer may be irradiated with laser light. Accordingly, local heating can be done, thereby suppressing the semiconductor device from being damaged due to the heating for the activation of the collector layer.

In the above-described manufacturing method, an emitter wire having a melting point lower than that of the emitter electrode may be formed on the emitter electrode before forming the p type Si collector layer. In this case, by using the Si layer formed at a relatively low temperature as the collector layer, there can be suppressed damage, which is more likely to occur by heating the emitter wire having low heat resistance.

In the above-described manufacturing method, at least a portion of the n type single-crystal substrate may be removed after the step of forming the n type drift layer. Accordingly, the semiconductor device can be thinned.

In the above-described manufacturing method, a p type SiC layer facing the second surface of the n type drift layer may be formed before forming the p type Si collector layer, the p type SiC layer being formed by implanting an acceptor type impurity into the silicon carbide substrate by means of an ion implantation method and irradiating the silicon carbide substrate with laser light. In this case, by forming the p type Si collector layer in contact with the p type SiC layer, the p type Si collector layer is formed.

In this way, in addition to the p type Si collector layer, the p type SiC layer can be used as a source of supply of positive holes into the n type drift layer. Thus, more sufficient amount of positive holes can be supplied into the n type drift layer.

As described above, according to the present invention, there can be readily manufactured a semiconductor device having a silicon carbide substrate and a p type collector layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
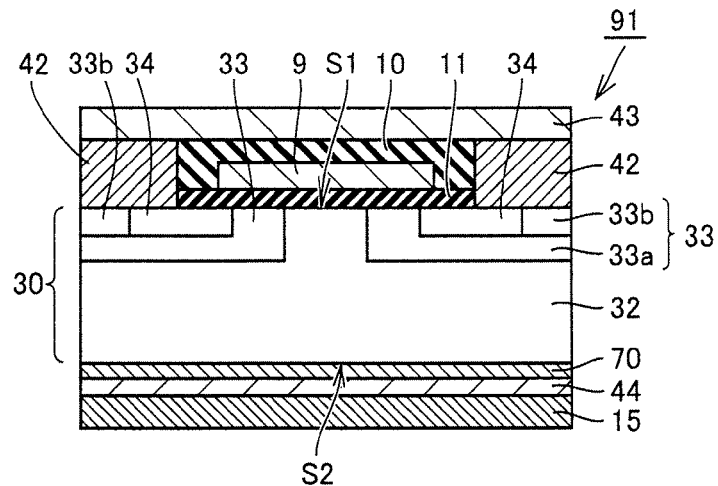
FIG. 1 is a cross sectional view schematically showing a configuration of a semiconductor device in a first embodiment of the present invention.

The following describes embodiments of the present invention with reference to figures. It should be noted that in the below-mentioned figures, the same or corresponding portions are given the same reference characters and are not described repeatedly. Regarding crystallographic indications of the present specification, an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

As shown in FIG. 1, an IGBT 91 (semiconductor device) of the present embodiment includes a silicon carbide substrate 30, a gate insulating film 11, a gate electrode 9, emitter electrodes 42, an emitter wire 43, a p type Si collector layer 70, a collector electrode 44, an interlayer insulating film 10, and a protecting electrode 15.

Silicon carbide substrate 30 is made of silicon carbide having a hexagonal crystal structure or silicon carbide having a cubic crystal form. Silicon carbide substrate 30 has an n type drift layer 32, p type body regions 33, and n type emitter regions 34.

N type drift layer 32 has an upper surface S1 (first surface) and a lower surface S2 (second surface) opposite to each other. In the case where silicon carbide substrate 30 has a hexagonal crystal structure, upper surface S1 preferably includes a {0001} plane or a plane inclined by 4° or smaller relative to the {0001} plane. In the case where silicon carbide substrate 30 has a cubic crystal structure, upper surface S1 includes a {100} plane.

N type emitter regions 34 are provided on p type body regions 33. Further, n type emitter regions 34 are separated from n type drift layer 32 by p type body regions 33.

Each of p type body regions 33 is provided in upper surface S1 of n type drift layer 32. Further, p type body region 33 has a p region 33a, and a p+ region 33b. P+ region 33b has an impurity concentration higher than that of p region 33a. P region 33a is in contact with gate insulating film 11. P+ region 33b is in contact with emitter electrode 42.

Gate insulating film 11 is provided on p type body region 33 so as to connect n type drift layer 32 and n type emitter regions 34 to one another. Gate insulating film 11 is made of, for example, silicon oxide ($SiO_2$) formed by a thermal oxidation method. Gate electrode 9 is provided on gate insulating film 11.

Emitter electrode 42 is in contact with each of n type emitter region 34 and p+ region 33b of p type body region 33. Emitter wire 43 is provided on emitter electrode 42 and is electrically connected to emitter electrode 42. Emitter wire 43 is made of, for example, aluminum.

P type Si collector layer 70 is provided directly on silicon carbide substrate 30 so as to face lower surface S2 of n type drift layer 32. P type Si collector layer 70 may be made of polysilicon or amorphous silicon.

Collector electrode 44 is an ohmic electrode provided on p type Si collector layer 70. Collector electrode 44 includes: a Ni layer facing p type Si collector layer 70; and a Au layer provided on the Ni layer, for example. Instead of the Ni layer and the Au layer, a Ti layer and an Al layer may be used, respectively. Protecting electrode 15 covers collector electrode 44.

The following describes gist of usage of IGBT 91. A voltage is applied between emitter wire 43 and protecting electrode 15 such that protecting electrode 15 has a positive potential relative to emitter wire 43. Electric conduction between emitter wire 43 and protecting electrode 15 is switched in accordance with a potential applied to gate electrode 9.

Specifically, when gate electrode 9 is fed with a negative potential exceeding a threshold value, an inversion layer is formed in each p type body region 33 at a region (channel region) facing gate electrode 9 with gate insulating film 11 interposed therebetween. Accordingly, n type emitter region 34 and n type drift layer 32 are electrically connected to each other. Accordingly, electrons are injected from n type emitter region 34 into n type drift layer 32. Correspondingly, positive holes are supplied from p type Si collector layer 70 into n type drift layer 32. As a result, conductivity modulation takes place in n type drift layer 32, thus significantly decreasing a resistance between emitter electrode 42 and collector electrode 44. In other words, IGBT 90 is brought into ON state.

Meanwhile, when gate electrode 9 is not fed with the above-described potential, no inversion layer is formed in the channel region, thereby maintaining a reverse-bias state between n type drift layer 32 and p type body region 33. Thus, IGBT 90 is in OFF state.

The following describes a method for manufacturing IGBT 91.

Figure 2:
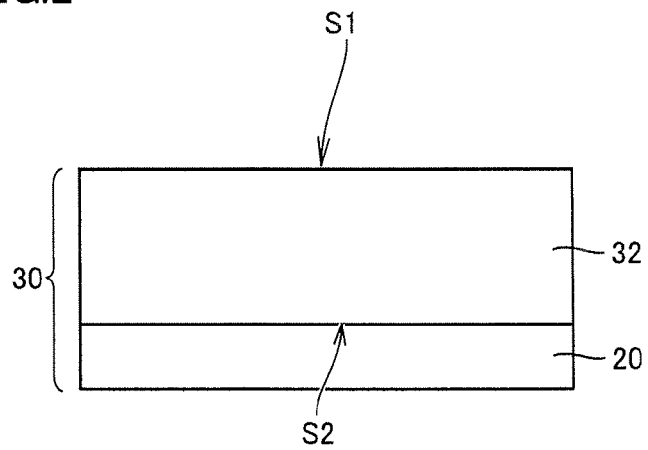
FIG. 2 is a cross sectional view schematically showing a first step in a method for manufacturing the semiconductor device of FIG. 1.

Referring to FIG. 2, an n type single-crystal substrate 20 made of silicon carbide is prepared. Preferably, n type single-crystal substrate 20 has the same crystal structure as that of silicon carbide substrate 30 (FIG. 1). More preferably, n type single-crystal substrate 20 has a main surface (upper surface in the figure) having the same plane orientation as that of upper surface S1.

Next, n type drift layer 32 is formed on n type single-crystal substrate 20. N type drift layer 32 has upper surface S1 and lower surface S2 opposite to each other. Lower surface S2 faces n type single-crystal substrate 20. In this way, silicon carbide substrate 30 is formed which has n type single-crystal substrate 20 and n type drift layer 32 provided thereon.

The formation of n type drift layer 32 is performed by epitaxially growing silicon carbide on n type single-crystal substrate 20 while adding a donor type impurity. The epitaxial growth is performed by, for example, chemical vapor deposition (CVD) method. In the CVD method, a film formation temperature is approximately 1400° C., for example. As a source material gas in the CVD method, a mixed gas of silane ($SiH_4$) and propane ($C_3H_8$) can be used. As the donor type impurity, nitrogen (N) or phosphorus (P) can be used, for example. As a carrier gas for the source material gas, hydrogen gas ($H_2$) can be used, for example.

Figure 3:
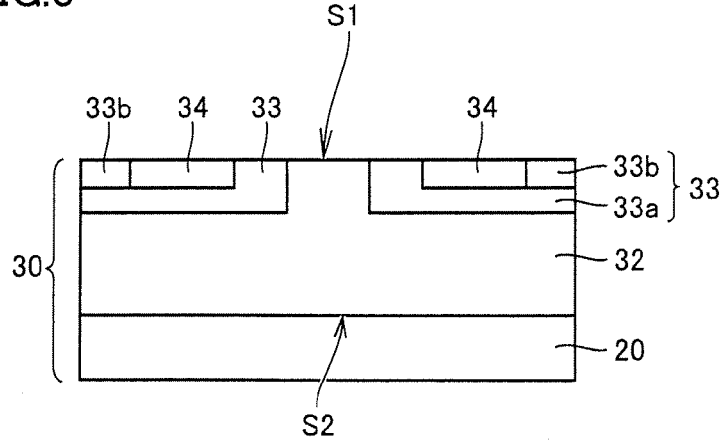
FIG. 3 is a cross sectional view schematically showing a second step in the method for manufacturing the semiconductor device of FIG. 1.

Referring to FIG. 3, p type body regions 33 each having p region 33a and p+ region 33b, and n type emitter regions 34 are formed by means of ion implantation. Each of p type body regions 33 is formed in upper surface S1 of n type drift layer 32. Each of n type emitter regions 34 is formed on p type body region 33 and is separated from n type drift layer 32 by p type body region 33. In the ion implantation for forming p type body region 33, aluminum (Al) or the like can be implanted, for example. In the ion implantation for forming n type emitter region 34, phosphorus (P) or the like can be implanted, for example.

Next, heat treatment is performed to activate the implanted impurities. Preferably, the heat treatment is performed at a temperature of more than 1600° C., preferably 1750° C. or greater. Further, the heat treatment is preferably performed at a temperature of not more than 1900° C. For example, the heat treatment is performed at a temperature of approximately 1750° C. The heat treatment is performed for approximately 30 minutes, for example. The atmosphere of the heat treatment is preferably an inert gas atmosphere, such as Ar atmosphere.

Figure 4:
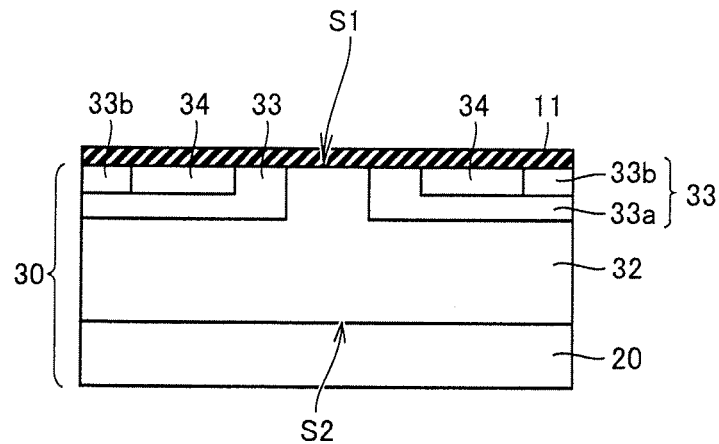
FIG. 4 is a cross sectional view schematically showing a third step in the method for manufacturing the semiconductor device of FIG. 1.

Referring to FIG. 4, gate insulating film 11 is formed on silicon carbide substrate 30. For example, a surface of silicon carbide substrate 30 is thermally oxidized.

Figure 5:
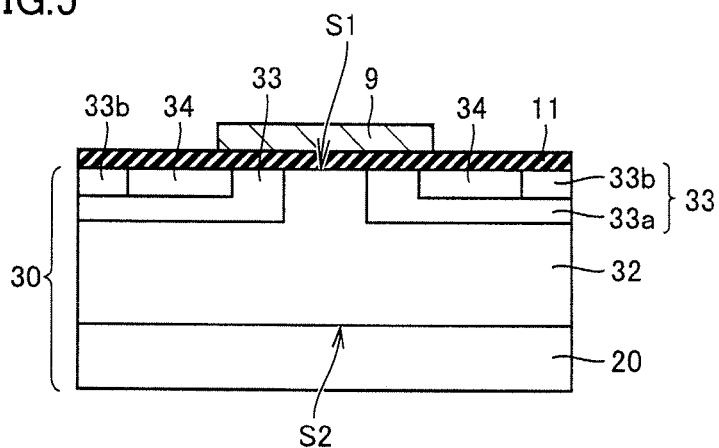
FIG. 5 is a cross sectional view schematically showing a fourth step in the method for manufacturing the semiconductor device of FIG. 1.

Referring to FIG. 5, gate electrode 9 is formed on gate insulating film 11. For example, first, the CVD method is employed to form a polysilicon film having a high electric conductivity provided by adding an impurity therein. Then, this film is patterned.

Figure 6:
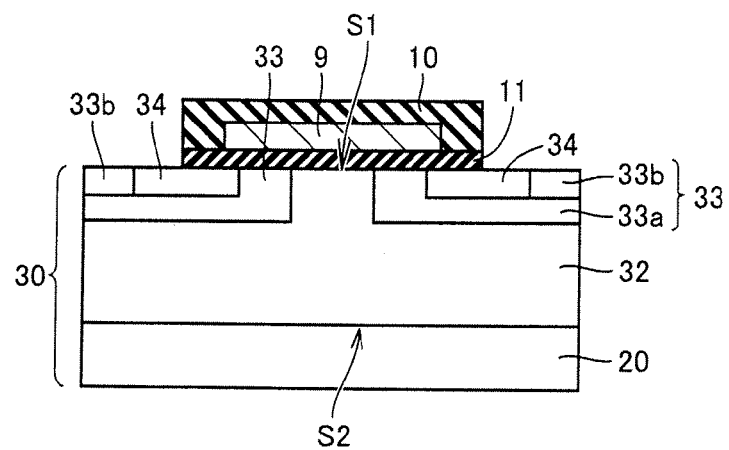
FIG. 6 is a cross sectional view schematically showing a fifth step in the method for manufacturing the semiconductor device of FIG. 1.

Referring to FIG. 6, interlayer insulating film 10 is formed. Further, gate insulating film 11 is patterned to have a remaining portion connecting n type drift layer 32 and n type emitter region 34 to each other on p type body region 33.

Figure 7:
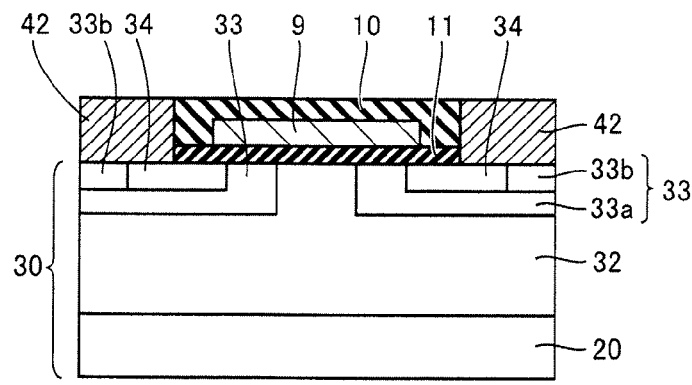
FIG. 7 is a cross sectional view schematically showing a sixth step in the method for manufacturing the semiconductor device of FIG. 1.

Referring to FIG. 7, emitter electrodes 42 are formed which are ohmic electrodes in contact with n type emitter regions 34 and p type body regions 33.

Figure 8:
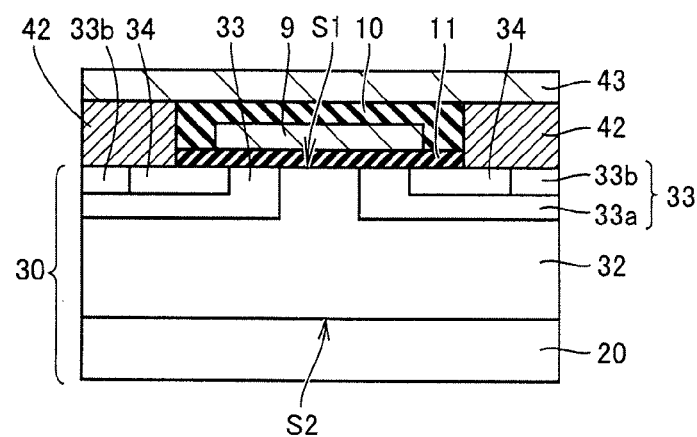
FIG. 8 is a cross sectional view schematically showing a seventh step in the method for manufacturing the semiconductor device of FIG. 1.

Referring to FIG. 8, emitter wire 43 is formed on emitter electrode 42. Emitter wire 43 may have a melting point lower than that of each emitter electrode 42. For example, emitter wire 43 is made of aluminum.

Figure 9:
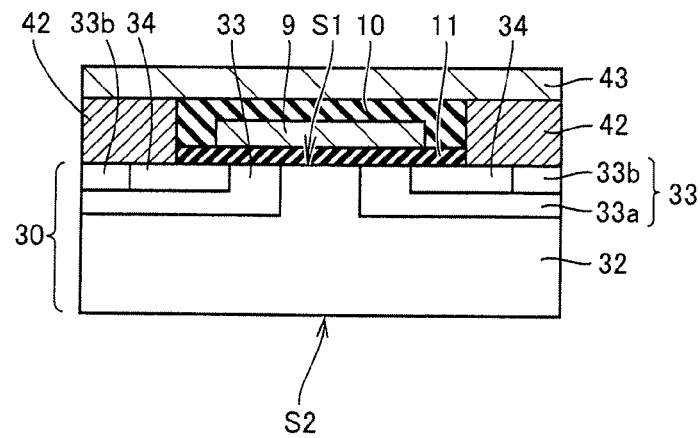
FIG. 9 is a cross sectional view schematically showing an eighth step in the method for manufacturing the semiconductor device of FIG. 1.

Referring to FIG. 9, at least a portion of n type single-crystal substrate 20 (FIG. 8) is removed from silicon carbide substrate 30. In the present embodiment, whole of n type single-crystal substrate 20 is removed. As a method for removing n type single-crystal substrate 20, a back grind process can be employed, for example. It should be noted that the step of removing at least the portion of n type single-crystal substrate 20 is performed at least after the step of forming n type drift layer 32. In the present embodiment, the step of removing is performed after forming the emitter electrode system, i.e., emitter electrodes 42 and emitter wire 43.

Figure 10:
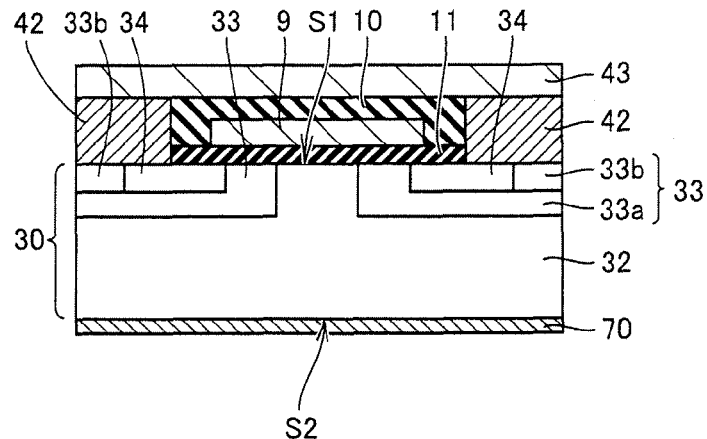
FIG. 10 is a cross sectional view schematically showing a ninth step in the method for manufacturing the semiconductor device of FIG. 1.

Referring to FIG. 10, by depositing silicon on silicon carbide substrate 30 while adding an acceptor type impurity thereto, p type Si collector layer 70 is formed to face second surface S2 of n type drift layer 32. Specifically, for example, a p type polysilicon film is formed by means of the CVD method. The film forming temperature is, for example, approximately 600° C. It should be noted that instead of polysilicon, an amorphous silicon film may be formed.

Figure 11:
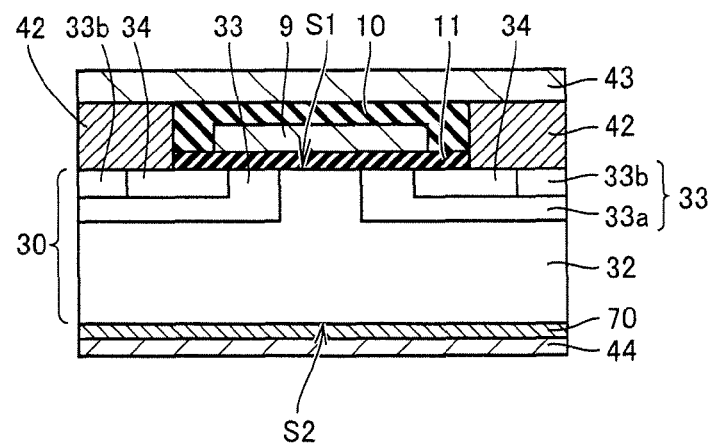
FIG. 11 is a cross sectional view schematically showing a tenth step in the method for manufacturing the semiconductor device of FIG. 1.

Referring to FIG. 11, collector electrode 44 serving as an ohmic electrode is formed on p type Si collector layer 70.

Referring to FIG. 1 again, protecting electrode 15 is formed to cover collector electrode 44. In this way, IGBT 91 is obtained.

It should be noted that in the above-described manufacturing method, activation heat treatment may be provided to p type Si collector layer 70. This activation heat treatment may be performed at a temperature lower than a temperature normally employed when activating an impurity implanted into silicon carbide by means of ion implantation. Specifically, the heat treatment is performed at a temperature lower than the melting point of the material of p type Si collector layer 70, i.e., the melting point of silicon, for example, at a temperature of 1400° C. or smaller. For example, the heat treatment is performed at a temperature of approximately 1000° C. Further, the activation heat treatment may be performed by means of laser annealing. In other words, during the activation heat treatment, p type Si collector layer 70 may be irradiated with laser light. Further, the activation heat treatment is preferably performed before forming the collector electrode on p type Si collector layer 70.

According to the present embodiment, each of the emitter region, the body region, and the drift region in IGBT 91 (FIG. 1) is made of silicon carbide, so that a semiconductor device employing properties of silicon carbide is obtained. Further, because the Si layer is used as the collector layer, epitaxial growth of p type SiC, which is highly difficult, is not required in forming the collector layer. Hence, IGBT 91 can be manufactured more readily.

Further, by using the Si layer as the collector layer, heating temperature required for formation of the collector layer becomes low. Accordingly, IGBT 91 can be suppressed from being damaged due to heating during the formation of the collector layer. In the case where p type Si collector layer 70 is made of amorphous silicon, p type Si collector layer 70 can be formed at a temperature lower than that in the case where p type Si collector layer 70 is made of polysilicon. Accordingly, IGBT 91 can be more suppressed from being damaged due to the heating. In the case where p type Si collector layer 70 is made of polysilicon, p type Si collector layer 70 can be adapted to have an electric conductivity higher than that in the case where p type Si collector layer 70 is made of amorphous silicon.

In the case where activation heat treatment for p type Si collector layer 70 is performed, the impurity in p type Si collector layer 70 can be activated more.

In the case where emitter wire 43 having a lower melting point than that of emitter electrode 42 is formed on emitter electrode 42 before forming p type Si collector layer 70, damage, which is more likely to occur due to heating of emitter wire 43 having low heat resistance, can be suppressed by using a Si layer formed at a temperature lower than that of a SiC layer as the collector layer.

In the case where at least a portion of the n type single-crystal substrate is removed after the step of forming n type drift layer 32, IGBT 91 can be thinned.

In the case where the collector electrode is formed on p type Si collector layer 70 after performing the activation heat treatment, electrical connection with p type Si collector layer 70 can be readily achieved.

In the case where p type Si collector layer 70 is irradiated with laser light during the activation heat treatment, local heating can be done, thereby suppressing IGBT 91 from being damaged due to heating for activation of the collector layer.

Second Embodiment

Figure 12:
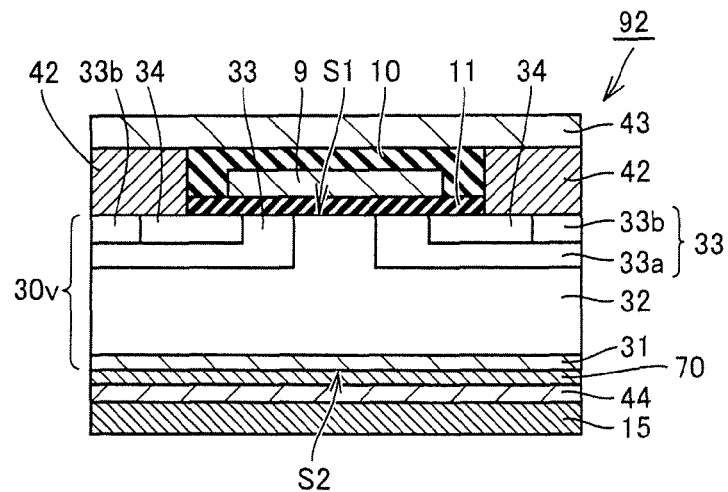
FIG. 12 is a cross sectional view schematically showing a configuration of a semiconductor device in a second embodiment of the present invention.

Referring to FIG. 12, in an IGBT 92 (semiconductor device) of the present embodiment, a silicon carbide substrate 30v includes a p type SiC layer 31. P type SiC layer 31 is separated from p type body region 33 by n type drift layer 32, and is directly disposed on p type Si collector layer 70. Apart from the configuration described above, the configuration of the present embodiment is substantially the same as the configuration of the first embodiment. Hence, the same or corresponding elements are given the same reference characters and are not described repeatedly.

The following describes a manufacturing method in the present embodiment. First, the same steps as the steps from FIG. 2 to FIG. 9 in the first embodiment are performed.

Figure 13:
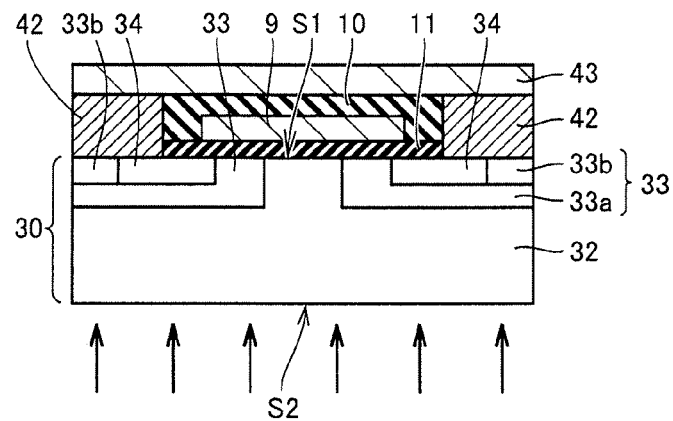
FIG. 13 is a cross sectional view schematically showing a first step in a method for manufacturing the semiconductor device of FIG. 12.
Figure 14:
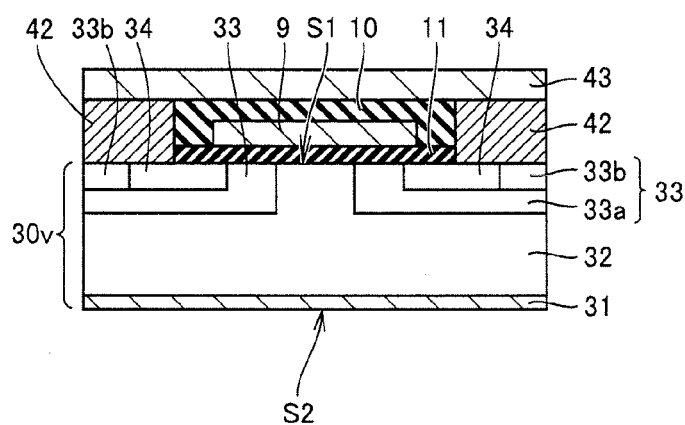
FIG. 14 is a cross sectional view schematically showing a second step in the method for manufacturing the semiconductor device of FIG. 12.

Referring to FIG. 13 and FIG. 14, an ion implantation method is then performed as indicated by arrows shown therein, thereby implanting an acceptor type impurity into silicon carbide substrate 30. Next, in order to activate the impurity thus implanted, laser annealing is performed. In other words, silicon carbide substrate 30 is irradiated with laser light. Accordingly, p type SiC layer 31 is formed to face second surface S2 of n type drift layer 32. In other words, by forming p type SiC layer 31 on silicon carbide substrate 30 (FIG. 9), silicon carbide substrate 30v (FIG. 14) is formed.

Figure 15:
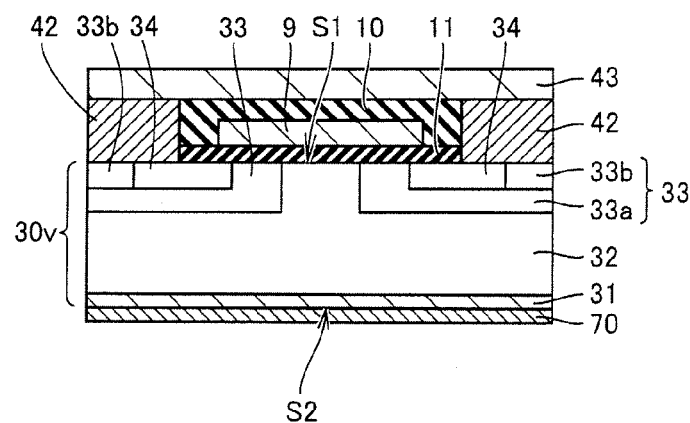
FIG. 15 is a cross sectional view schematically showing a third step in the method for manufacturing the semiconductor device of FIG. 12.

Referring to FIG. 15, p type Si collector layer 70 is formed in contact with p type SiC layer 31. A specific formation method is substantially the same as the process of FIG. 10.

Next, p type SiC layer 31 and p type Si collector layer 70 are subjected to activation heat treatment. During the activation heat treatment, p type SiC layer 31 and p type Si collector layer 70 may be irradiated with laser light. A specific heat treatment method is substantially the same as the heat treatment method for p type Si collector layer 70 in the first embodiment.

Referring to FIG. 12 again, on p type Si collector layer 70, collector electrode 44 serving as an ohmic electrode is formed. Next, protecting electrode 15 is formed to cover collector electrode 44. In this way, IGBT 92 is obtained.

According to the present embodiment, by implanting the acceptor type impurity into lower surface S2 of n type drift layer 32 by means of the ion implantation method before forming p type Si collector layer 70 and then irradiating it with laser light (FIG. 13), p type SiC layer 31 is formed on lower surface S2 of n type drift layer 32 (FIG. 14). Further, by forming p type Si collector layer 70 in contact with p type SiC layer 31, p type Si collector layer 70 is formed. In this way, in addition to p type Si collector layer 70, p type SiC layer 31 can be used as a source of supply of positive holes into n type drift layer 32. Thus, more sufficient amount of positive holes can be supplied into n type drift layer 32.

It should be noted that the activation heat treatment is performed after p type Si collector layer 70 is formed in the present embodiment, but the activation heat treatment may be performed after p type SiC layer 31 is formed and before p type Si collector layer 70 is formed. In this way, damage on p type Si collector layer 70 in the heat treatment can be avoided. As a method for the activation heat treatment, the same method as that in the first embodiment can be used, for example.

In the present specification, the expression "upper surface S1 includes a {100} plane" is intended to indicate a concept including both a case where upper surface S1 substantially corresponds to the {100} plane and a case where there are a plurality of crystal planes constituting upper surface S1 and one of the crystal planes is the {100} plane.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
    forming a silicon carbide substrate having an n type single-crystal substrate made of silicon carbide and an n type drift layer provided thereon, by epitaxially growing silicon carbide on said n type single-crystal substrate while adding a donor type impurity thereto, said n type drift layer having first and second surfaces opposite to each other, said second surface facing said n type single-crystal substrate;
    forming a p type body region disposed in said first surface of said n type drift layer, and an n type emitter region disposed on said p type body region and separated from said n type drift layer by said p type body region;
    forming a gate insulating film on said p type body region so as to connect said n type drift layer and said n type emitter region to each other;
    forming a gate electrode on said gate insulating film;
    forming an emitter electrode in contact with each of said n type emitter region and said p type body region;
    forming a p type Si collector layer facing said second surface of said n type drift layer, by depositing silicon on said silicon carbide substrate while adding an acceptor type impurity thereto; and
    forming an emitter wire on said emitter electrode before the step of forming said p type Si collector layer, said emitter wire having a melting point lower than that of said emitter electrode.

2. The method for manufacturing the semiconductor device according to claim 1, further comprising the step of performing activation heat treatment for said p type Si collector layer.

3. The method for manufacturing the semiconductor device according to claim 2, further comprising the step of forming a collector electrode on said p type Si collector layer after the step of performing said activation heat treatment.

4. The method for manufacturing the semiconductor device according to claim 2, wherein the step of performing said activation heat treatment includes the step of irradiating said p type Si collector layer with laser light.

5. The method for manufacturing the semiconductor device according to claim 1, further comprising the step of removing at least a portion of said n type single-crystal substrate after the step of forming said n type drift layer.

6. A method for manufacturing a semiconductor device, comprising the steps of:
    forming a silicon carbide substrate having an n type single-crystal substrate made of silicon carbide and an n type drift layer provided thereon, by epitaxially growing silicon carbide on said n type single-crystal substrate while adding a donor type impurity thereto, said n type drift layer having first and second surfaces opposite to each other, said second surface facing said n type single-crystal substrate;
    forming a p type body region disposed in said first surface of said n type drift layer, and an n type emitter region disposed on said p type body region and separated from said n type drift layer by said p type body region;
    forming a gate insulating film on said p type body region so as to connect said n type drift layer and said n type emitter region to each other;
    forming a gate electrode on said gate insulating film;
    forming an emitter electrode in contact with each of said n type emitter region and said p type body region;
    forming a p type Si collector layer facing said second surface of said n type drift layer, by depositing silicon on said silicon carbide substrate while adding an acceptor type impurity thereto; and
    forming a p type SiC layer facing said second surface of said n type drift layer before the step of forming said p type Si collector layer, said p type SiC layer being formed by implanting an acceptor type impurity into said silicon carbide substrate by means of an ion implantation method and irradiating said silicon carbide substrate with laser light, wherein
    the step of forming said p type Si collector layer is performed by forming said p type Si collector layer in contact with said p type SiC layer.

7. A method for manufacturing a semiconductor device, comprising the steps of:
    forming a silicon carbide substrate having an n type single-crystal substrate made of silicon carbide and an n type drift layer provided thereon, by epitaxially growing silicon carbide on said n type single-crystal substrate while adding a donor type impurity thereto, said n type drift layer having first and second surfaces opposite to each other, said second surface facing said n type single-crystal substrate;
    forming a p type body region disposed in said first surface of said n type drift layer, and an n type emitter region disposed on said p type body region and separated from said n type drift layer by said p type body region;
    forming a gate insulating film on said p type body region so as to connect said n type drift layer and said n type emitter region to each other;
    forming a gate electrode on said gate insulating film;
    forming an emitter electrode in contact with each of said n type emitter region and said p type body region; and
    forming a p type Si collector layer facing said second surface of said n type drift layer, by depositing a p type polysilicon layer or a p type amorphous silicon layer on said silicon carbide substrate while adding an acceptor type impurity thereto.

* * * * *